United States Patent [19]

Teng et al.

[11] Patent Number: 4,864,375
[45] Date of Patent: Sep. 5, 1989

[54] DRAM CELL AND METHOD

[75] Inventors: Clarence W. Teng, Plano; Cheng-Eng D. Chen; Bor-Yen Mao, both of Richardson, all of Tex.

[73] Assignee: Texas Instruments Incorporated, Dallas, Tex.

[21] Appl. No.: 188,729

[22] Filed: Apr. 29, 1988

Related U.S. Application Data

[63] Continuation of Ser. No. 826,432, Feb. 5, 1986, abandoned.

[51] Int. Cl.⁴ .................. H01L 29/78; H01L 27/02; H01L 29/06; H01L 27/12
[52] U.S. Cl. ................................ 357/23.6; 357/41; 357/55; 357/49
[58] Field of Search .................. 357/23.6, 41, 55, 49

[56] References Cited

U.S. PATENT DOCUMENTS 4,713,678 12/1987 Womack et al. .................. 357/55

FOREIGN PATENT DOCUMENTS 0108390 5/1984 European Pat. Off. .

Primary Examiner—Andrew J. James
Assistant Examiner—Robert P. Limanek
Attorney, Agent, or Firm—Douglas A. Sorensen; Rodney M. Anderson; Melvin Sharp

[57] ABSTRACT

The following detailed description describes a dynamic random access memory (dRAM) cell. The described cell provides a one-transistor/one-capacitor dRAM cell structure and array in which the cell pass transistor is formed on the sidewalls of a trench containing the cell capacitor; the word and bit lines cross over this trench. The trench extends through an epitaxial layer into a substrate. The epitaxial layer and substrate are separated by a layer which serves as a diffusion barrier. This stacking of the transistor on top of the capcitor yields a cell with minimal area on the substrate and solves a problem of dense packing of cells. The diffusion barrier allows for the optimal doping of the epitaxial for operation of the transistor and optimal doping of the substrate for operation of the capacitor.

One capacitor plate and the transistor channel and source region are formed in the bulk sidewall of the trench, and the transistor gate and the other plate of the capacitor are both formed in polysilicon in the trench but separated from each other by an oxide layer inside the trench. The signal charge is transferred to the polysilicon capacitor plate transistor with the polysilicon capacitor plate. This connection between source and polysilicon capacitor plate is provided by a buried lateral contact.

4 Claims, 9 Drawing Sheets

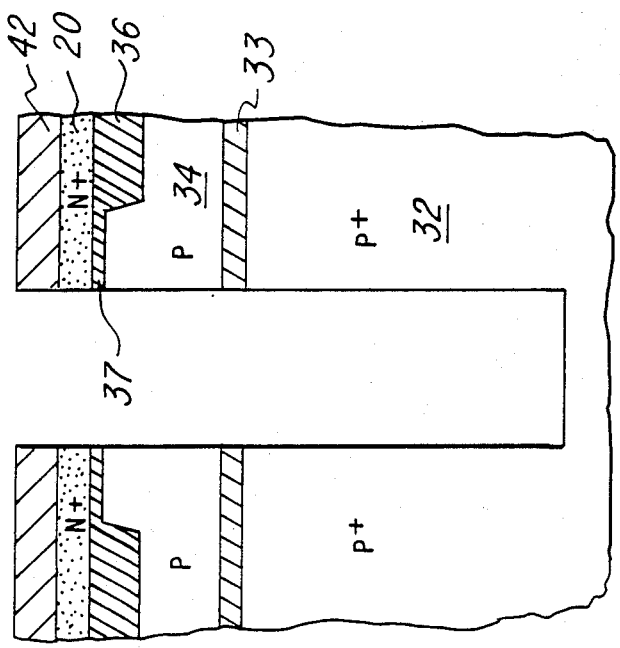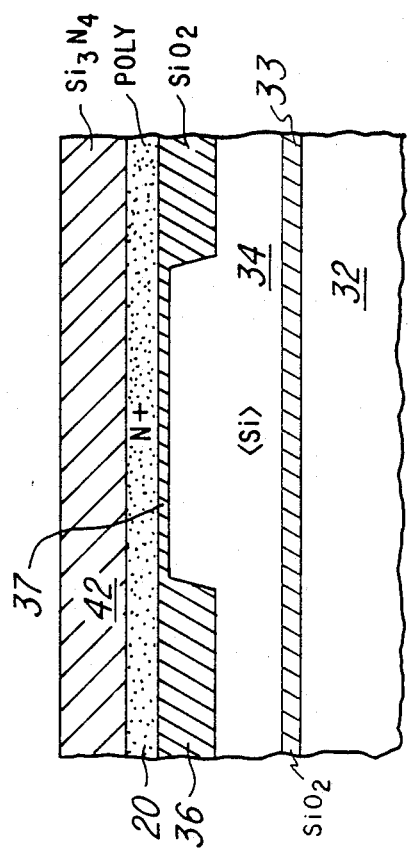
Fig. 4D
Fig. 4C

DRAM CELL AND METHOD

This application is a continuation of application Ser. No. 826,432, filed Feb. 5, 1986 now abandoned.

FIELD OF THE INVENTION

The present invention relates to the field of integrated circuit devices. More specifically, the present invention relates to the field of integrated memory devices.

BACKGROUND OF THE INVENTION

In copending application U.S. application Ser. No. 666,715, which is wholly assigned to the assignee of this application and which is hereby incorporated by reference, a trench memory cell structure is disclosed having a transistor and a storage capacitor formed inside a trench. The transistor is formed so that its channel is a portion of the substrate at the sidewall of the trench and occupies the upper portion of the trench (that is, the portion of the trench nearest the opening of the trench to the surface of the substrate). A polycrystalline silicon region formed in the lower portion of the trench serves as one plate of the capacitor. The substrate serves as the other plate. The plates are separated by an insulator, such as silicon dioxide, formed on the walls of the lower portion of the trench. Thus the substrate serves two distinct functions within the memory cell: as a channel region for the pass transistor and as a plate for the capacitor. However, these functions create competing demands for the doping characteristics of the substrate.

Ideally, the threshold voltage of the pass transistor is just high enough to insure that the transistor shuts off. This low threshold allows the pass transistor to be turned on by a signal on the word line in spite of the voltage drop across the long word lines of modern VLSI memory circuits. The threshold voltage of the pass transistor is directly dependent on the doping of the channel region. Thus the substrate should have a relatively low doping level.

On the other hand, the substrate needs a different doping level for optimal performance as one plate of the capacitor. Metal-oxide semiconductor(MOS) capacitors do not behave as a simple capacitor having two plates separated by a dielectric material. The stored charge alters the characteristics of the semiconductor material. For example, with a positive charge stored on the plate inside the trench and a P type doped substrate, at some level of positive charge enough negative charge carriers(electrons) are drawn to the surface of the silicon dioxide layer separating the two plates to invert the portion of the substrate adjacent to the silicon dioxide to N type. Thus a depletion barrier forms at the point of inversion from P to N type, stopping the flow of carriers across the depletion barrier, and creating, in essence, a second capacitor in series with the MOS capacitor. The resulting capacitance is determined by the equation:

$$C_{TOT} = \frac{C_1 + C_2}{C_1 \cdot C_2}$$

from elementary circuit theory. It is desirable to maximize $C_{TOT}$ because the charge stored in a capacitor is proportional to the capacitance of the capacitor. It is desirable to store maximum charge on the capacitor because data represented by the larger capacitance is less susceptible to alteration by stray fields in the array, alpha particles and other sources of soft errors.

The depletion barrier acts as a dielectric for the second capacitor($C_2$). Therefore, decreasing the width of the depletion barrier increases $C_2$ and thus $C_{TOT}$. One way of reducing the width of the depletion layer is increasing the doping level of the substrate. This yields two benefits. First, because there are more free carriers in heavily doped material, the depletion layer will consume less material in response to the same level of inversion. Second, the higher the doping level of the substrate, the greater the field necessary to create inversion. Thus a substrate doped highly enough will not invert and the second capacitance will not arise at all.

The described embodiment in U.S. application Ser. No. 666,715 cited above addresses this conflict by forming the capacitor of the cell in a heavily doped substrate and the transistor portion of the cell in a lightly doped epitaxial layer formed on the surface of this substrate. However, this solution does not solve the problem because processing steps subsequent to the formation of the epitaxial layer and time cause some of the dopant atoms in the substrate to diffuse into the epitaxial layer as is shown in the doping profile in FIG. 1. This raises the doping level of the epitaxial layer and lowers the doping level of the substrate near the capacitor, both undesirable effects for the reasons discussed above.

SUMMARY OF THE INVENTION

The following detailed description describes a dynamic random access memory (dRAM) cell. The described cell provides a one-transistor/one-capacitor dRAM cell structure and array in which the cell pass transistor is formed on the sidewalls of a trench containing the cell capacitor; the word and bit lines cross over this trench. The trench extends through an epitaxial layer into a substrate. The epitaxial layer and substrate are separated by a layer which serves as a diffusion barrier. This stacking of the transistor on top of the capacitor yields a cell with minimal area on the substrate and solves a problem of dense packing of cells. The diffusion barrier allows for the optimal doping of the epitaxial layer for operation of the transistor and optimal doping of the structure for operation of the capacitor.

One capacitor plate and the transistor channel and source region are formed in the bulk sidewall of the trench, and the transistor gate and the other plate of the capacitor are both formed in polysilicon in the trench but separated from each other by an oxide layer inside the trench. The signal charge is transferred to the polysilicon capacitor plate by an electrical connection of the source region of the vertical pass transistor with the polysilicon capacitor plate. This connection between source and polysilicon capacitor plate is provided by a buried lateral contact.

BRIEF DESCRIPTION OF THE DRAWINGS

FIGS. 4A through 4I illustrate a sequence of process steps for fabrication of one embodiment of a memory cell including the present invention by a method which is another embodiment of the present invention.

DESCRIPTION OF THE PREFERRED EMBODIMENTS

Figure 1:
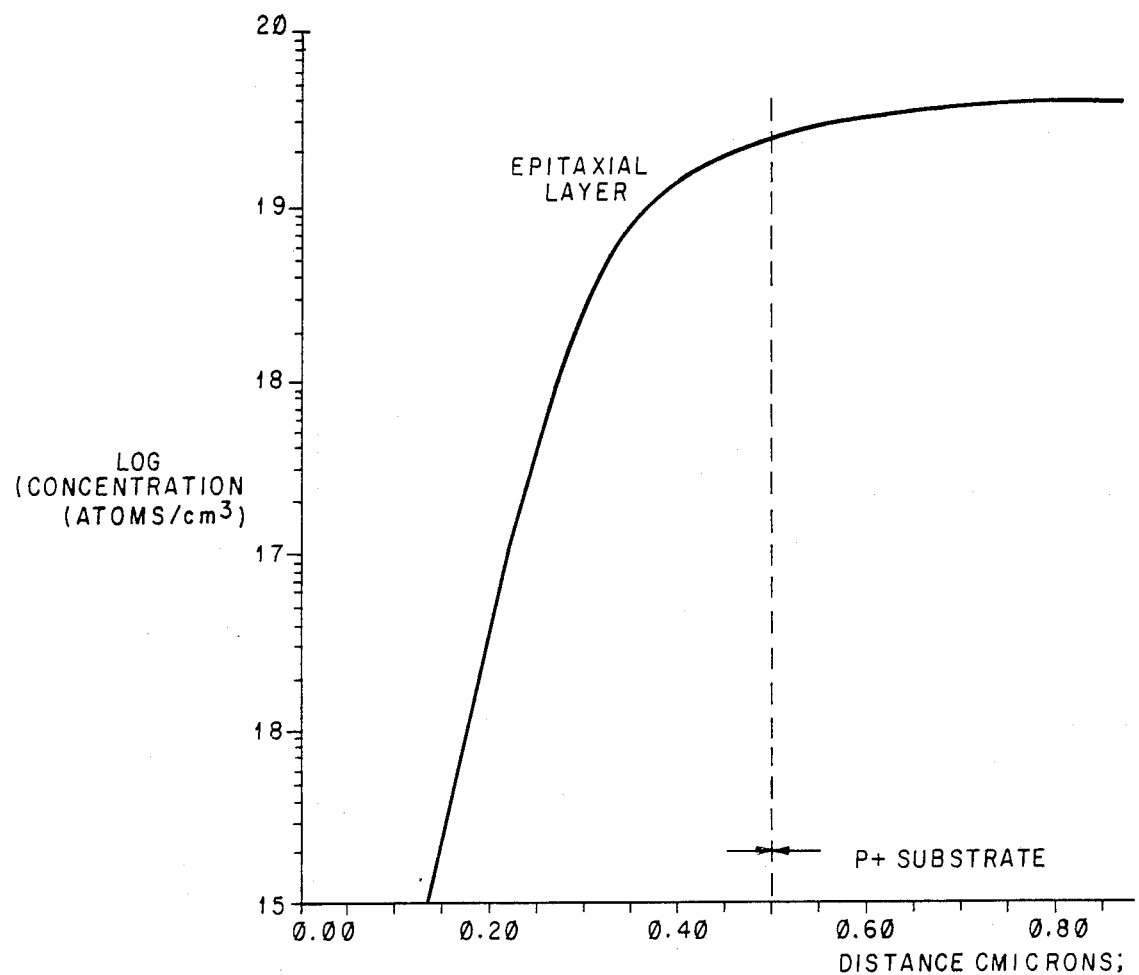
FIG. 1 is a doping profile graph of a P type epitaxial layer grown on a P+ substrate as is used in the fabrication of the cell described in U.S. application Ser. No. 666,175.
Figure 2A:
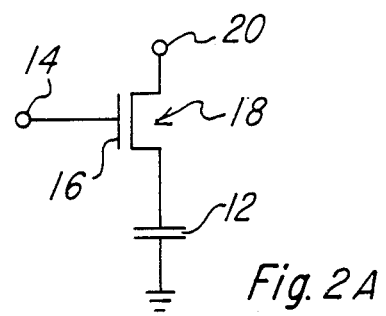
FIGS. 2A and 2B are the schematic equivalent circuit and local memory array geometry for preferred embodiment dRAM cells.

The preferred embodiment dRAM cells are one transistor/one capacitor cells connected to bit and word lines as shown in schematic FIG. 2A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operation. Leakage currents and other sources of decay of the charge on capacitor 12 necessitate periodic refreshing of the charge, and thus the name dynamic RAM (dRAM).

Figure 2B:
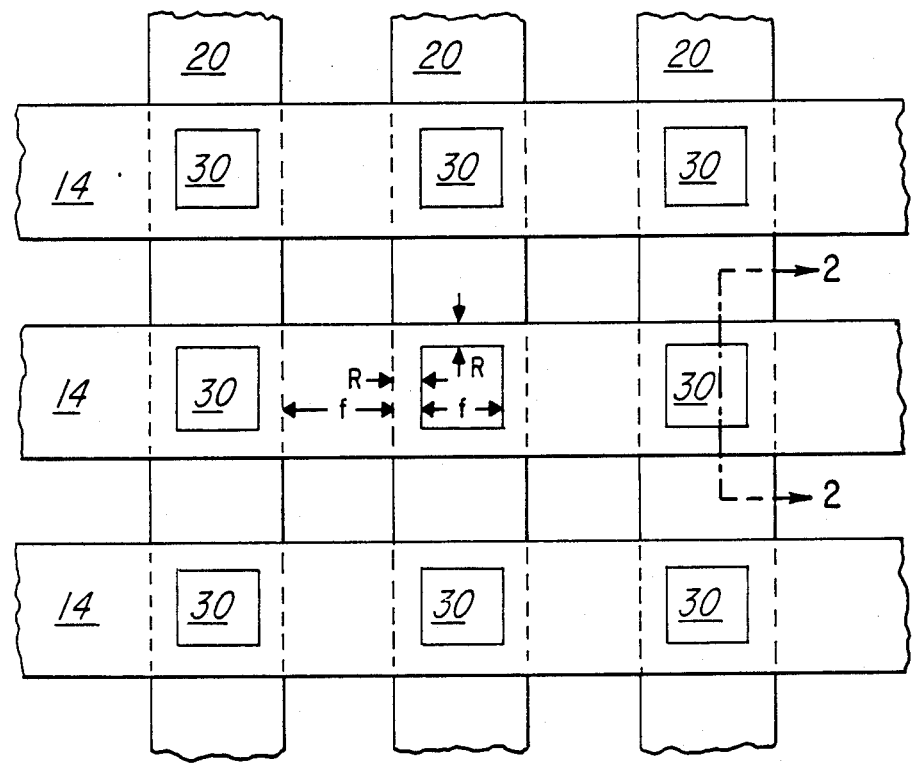

FIG. 2B is a plan view showing a portion of a dRAM array of bit lines 20 and word lines 14 with preferred embodiment cells 30 at the intersections of the lines; note that bit lines 20 pass under word lines 14. The cells 30 extend down into the substrate below the lines and provide a maximal density memory. If the minimum feature size is denoted by f and the minimum registration is denoted by R, then the cell area is $[2(f+R)]^2$. For example, with a minimum feature size of 1.0 micron and minimum registration tolerance of 0.25 micron, the cell area is about 6.25 square microns.

Figure 3:
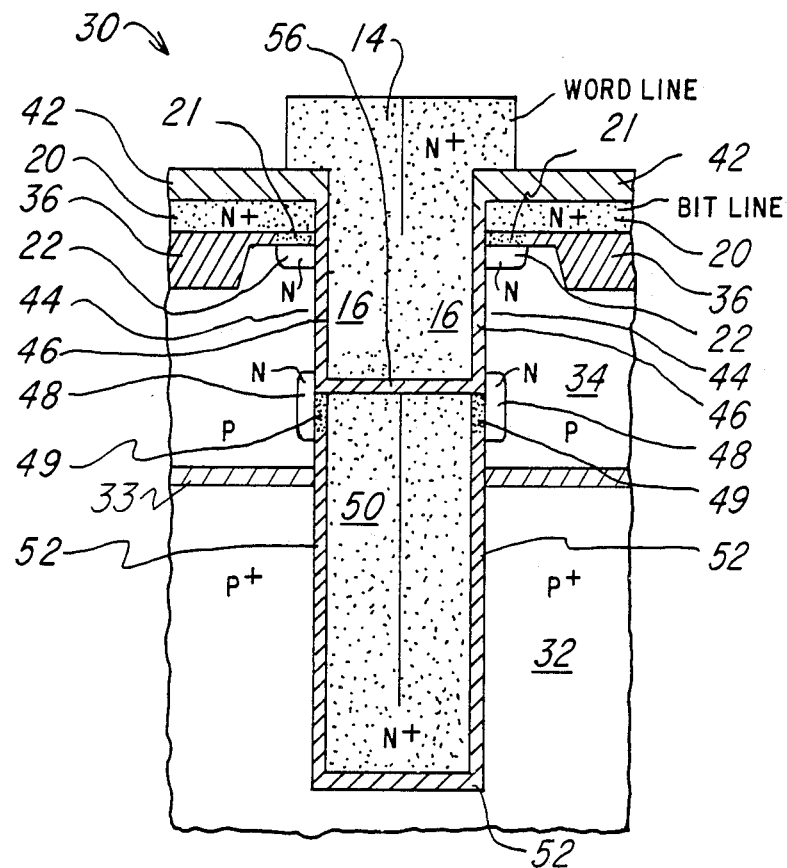
FIG. 3 is a schematic cross sectional elevation of a first preferred embodiment dRAM cell taken along line 2—2 of FIG. 2B.

FIG. 3 is a cross-sectional view of the first preferred embodiment dRAM cell, generally denoted 30. Cell 30 is formed in p+ silicon substrate 32, p epilayer 34 with silicon dioxide layer 33 interposed between substrate 32 and epilayer 34. Cell 30 includes n+ polysilicon bit line 20, bit line insulating nitride 42, field oxide 36, n+ polysilicon work line 14, transistor 18, channel 44, gate oxide 46, n diffused region 48 which forms the source for transistor 18, n+ polysilicon region 50 which forms one of the plates of capacitor 12 with p+ substrate 32 forming the other plate, oxide 52 which forms the insulator between the plates of capacitor 12, insulating oxide 56 which separates word line 14 from capacitor plate 50, n diffused region 22 which forms the drain of transistor 18, n polysilicon region 21 which connects bit line 20 with drain region 22, and n polysilicon region 49 which connects source 48 with n+ capacitor plate 50. Gate 16 of transistor 18 is simply that portion of word line 14 that is across gate oxide 46 from channel region 44. The view of cell 30 in FIG. 3 corresponds to a section along vertical line 2—2 in FIG. 2B; the square cross section of the trench containing capacitor 12 and transistor 18 is apparent in FIG. 2B.

Silicon dioxide layer 33 provides, among other things, a diffusion barrier between epilayer 34 and substrate 32. This allows substrate 32 to have a much higher doping concentration without raising the doping level of epilayer 34 and thus not raising the threshold voltage of transistor 18.

In cell 30 capacitor 12 is formed with one its plates being n+ region 50 together with n region 48 and the other plate being substrate 32 together with epilayer 34; however, the doping of epilayer 34 is much lower than that of p+ substrate 32 so the capacitance of the n/p junction of region 48 and epilayer 34 and the capacitance of n+ region 50/oxide 52/p epilayer 34 are both much less than the capacitance of n+ region 50/oxide 52/p+ substrate 32 and may be ignored. Also, as will be detailed below, the plate area of epilayer 34 is small compared to that of substrate 32, and this further makes insignificant the capacitance associated with epilayer 34. Consequently, the bulk of the charge stored by capacitor 12 is isolated from substrate 32 (and epilayer 34) by oxide 52. For a trench with a one micron by one micron cross section and the six micron depth, the capacitor 12 plate area would be about 21 square microns if one micron of the depth is epilayer 34 and bit line 20. P+ substrate 32 is the ground common to all cells 30 in an array.

Transistor 18 in cell 30 is entirely in bulk silicon with a polysilicon gate; channel region 44 is part of p epilayer 34, source region 48 (which is also a part of a plate of capacitor 12) and drain region 20 are n diffusions in p epilayer 34, gate oxide 46 is grown on the trench surface of p epilayer 34, and gate 16 is part of polysilicon word line 14. Field oxide 36 is fairly thick and minimizes the capacitance of bit line 20.

The dimensions and materials characteristic of cell 30 are best understood in connection with the following description of a first preferred embodiment method of fabrication; FIGS. 4A through 4I illustrate the sequence of process steps.

Figure 4A:
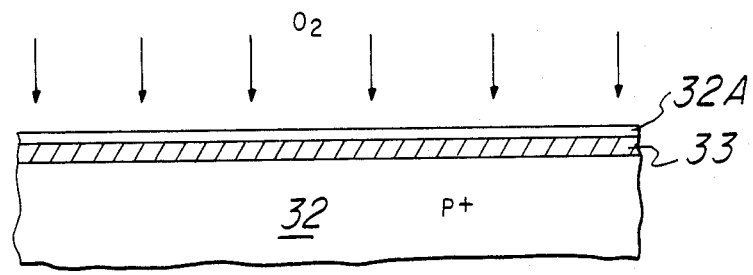
Figure 4B:
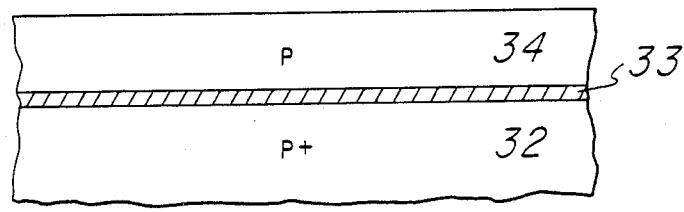

Silicon dioxide layer 33 (FIG. 4A) is formed just beneath the surface of (100) oriented p+ silicon substrate 32 which has a resistivity of less than 0.01 ohm-cm by implanting oxygen atoms having an density of approximately $2 \times 10^{18}$ atoms/cm$^2$ and a energy of approximately 150 KeV. This oxygen implant is annealed to form silicon dioxide layer 33 which is approximately 5,000 Å thick and is approximately 1,500 Å below the surface of substrate 32. The portion of substrate 32 above silicon dioxide layer 33 provides seed crystal for the formation of epilayer 34 which is grown with a carrier concentration of $2 \times 10^{16}$/cm$^3$ and thickness of approximately two microns as shown in FIG. 4B. Silicon dioxide is used to form layer 33 in this description as an example only, several other materials may be utilized to form adequate barrier layers. For example, nitrogen atoms implanted at an energy of approximately 150 KeV and at an energy of approximately $1.2 \times 10^{18}$ will provide a silicon nitride layer approximately 2,000 Å thick at approximately 3,000 Å below the surface of substrate 32.

Field oxide 36 (including protective oxide 37) is formed by standard processing. As an example, SWAMI process may be used (grow stress relief oxide, deposit low pressure chemical vapor deposition (LPCVD) nitride, pattern and plasma etch the nitride-oxide-silicon, boron implant for channel stops, grow second stress relief oxide, deposit second nitride, deposit LPCVD oxide, plasma etch LPCVD oxide-nitride, wet etch filaments of LPCVD oxide remaining from previous etch, thermally grow field oxide to yield an approximately planar structure, and strip the nitrides). Regardless of the method used, the final thickness of field oxide 36 is 5000 Å and protective oxide 37 is about 200 Å thick. 2000 Å of polysilicon 20 is deposited by LPCVD, doped to a carrier concentration of $1 \times 10^{20}$/cm$^3$, and patterned and etched to form bit lines 20. Optionally an n+ diffused bitline can be substituted for the polysilicon bitline. Next, 10,000 Å of nitride 42 is deposited by LPCVD; see FIG. 4C. A layer composed of deposited nitride and oxide could also be used for layer 42.

Nitride 42 is patterned to define the one micron square trenches. The patterned nitride 42 is then used as the mask for reactive ion etching (RIE) with hydrochloric acid excavation of the trenches to a depth of 8 microns. The trench walls are cleaned of RIE damage and contamination with a wet acid etch; see FIG. 4D. Note that nitride 42 is also partially removed by the RIE.

Oxide 52 is grown to a thickness of 200 Å on the trench walls and bottom. The trench is then filled with n+ doped polysilicon as part of a deposition of 7000 Å of n+ polysilicon by LPCVD; see FIG. 4E.

Figure 4F:
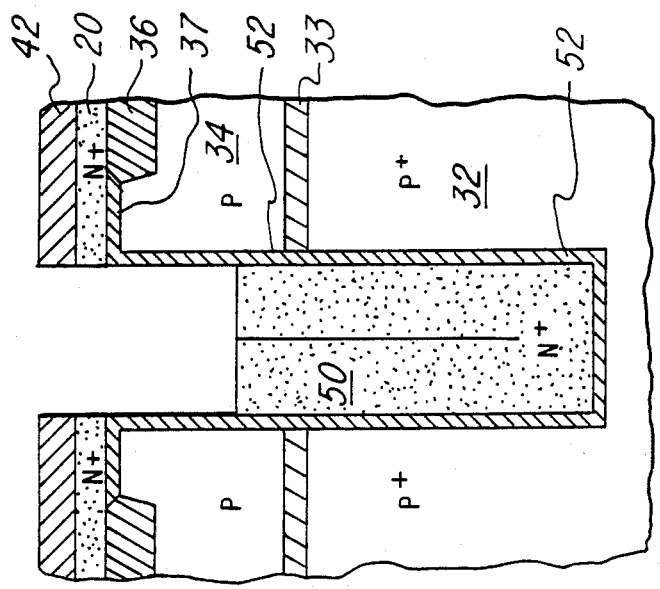
Figure 4E:
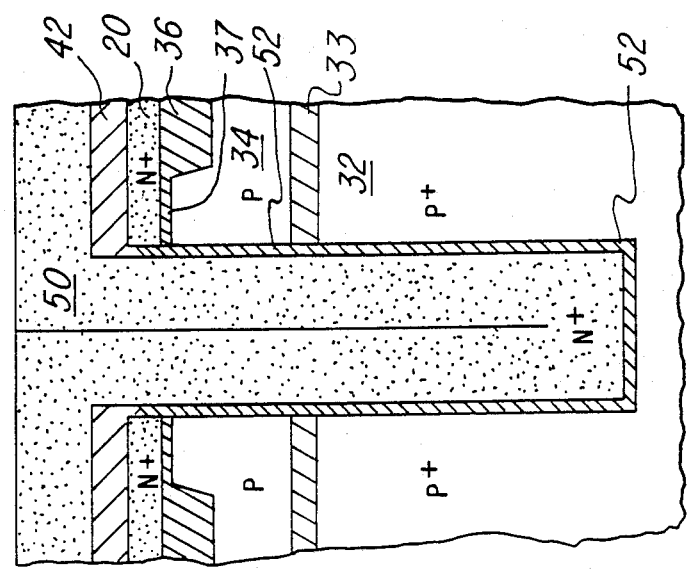

Polysilicon 50 is planarized, such as with spun on photoresist, and etched completely away on the surface and down into the trench to about 3000 Å above the silicon dioxide layer 33; see FIG. 4F. As will be seen below, the location of the top of the remaining polysilicon 50 in the trench will approximately determine the bottom of the channel of transistor 18. Note that nitride layer 42 is further eroded by the plasma etch but is still at least 2000 Å thick.

The exposed portion of oxide 52 is etched, and this etching is continued to overetch 1000 to 2000 Å of oxide. This overetch removes the top portion of oxide 52 between epilayer 34 and polysilicon 50 to a depth of 1000 to 2000 Å, as indicated by arrows 53 in FIG. 4G; and also removes 1000 to 2000 Å of protective oxide 37 between epilayer 34 and bit line 20, as indicated by arrows 39 in FIG. 4G. This overetch in effect is forming two small annular crevices, each with a depth of 1000 to 2000 Å and a width of 200 Å; one of these small crevices girdles the top portion of polysilicon 50 as indicated by arrows 53, and the other of these small crevices runs horizontally around the boundary of bit line 20 as indicated by arrows 39.

Figure 4H:
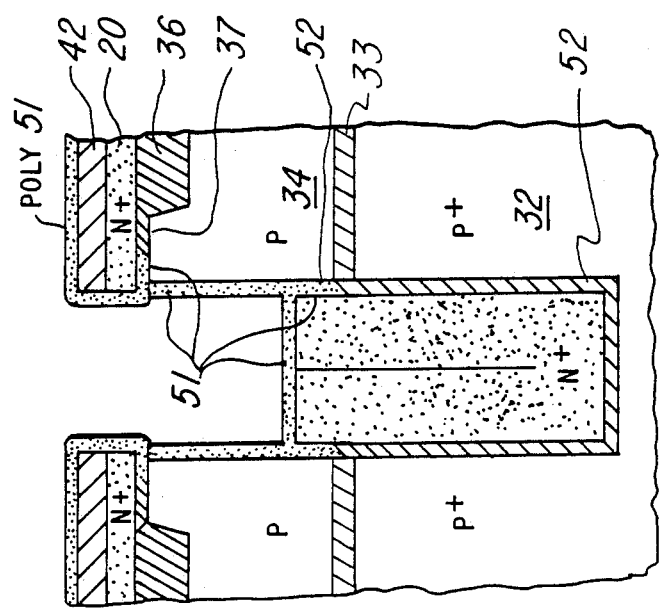
Figure 4G:
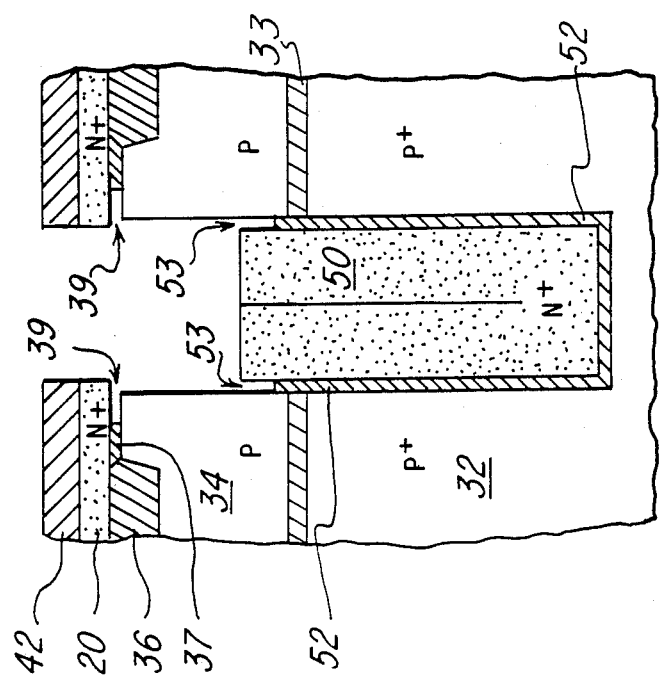
Figure 41:
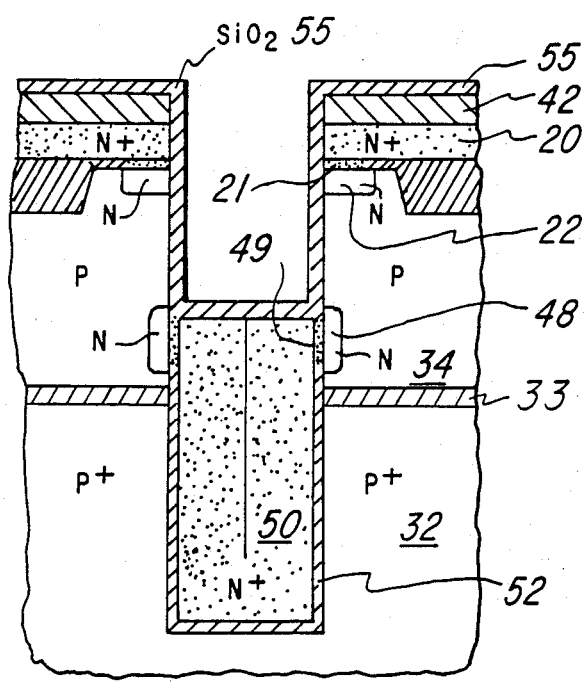

2500 Å of polysilicon 51 is deposited by LPCVD, this is sufficient thickness to insure that the small crevices indicated by arrows 53 and 39 in FIG. 4G are filled; see FIG. 4H.

500 Å of oxide 55 is thermally grown, this is just enough oxidation to oxidize all of polysilicon 51 except for that portion in the small crevices indicated by arrows 53 and 39 in FIG. 4G, which are too far from the oxidizing interface. This amount of oxidation also consumes very little of epilayer 34. The high temperatures of the thermal oxidation of polysilicon 51 causes the dopant in n+ polysilicon 50 to diffuse through the polysilicon 51 in the small crevice indicated by arrows 53 and into p epilayer 34; this diffusion of dopants forms n type polysilicon region 49 and n type region 48 in p epilayer 34; see FIG. 4I. Further, a similar diffusion of dopants from bit line 20 through the polysilicon in the small crevice indicated by arrows 39 and into epilayer 34 forms n polysilicon region 21 and n type region 22 in epilayer 34; see FIG. 4I. As an option, the 500 Å of polysilicon 51 can be removed by a timed wet chemical silicon etch from regions other than the refilled crevice regions 39 and 53. This can then be followed by a thermal anneal to diffuse the n+ dopants into regions 53 and 39. The n+ polysilicon contacts formed in regions 53 and 39 are called Buried Lateral Contacts. As can be seen from FIG. 4I, the Buried Lateral Contacts allows the trench transistor to be connected to the trench capacitor and to the polysilicon bitline in an efficient and compact manner.

Oxide 55 is etched away, and gate oxide 46 plus insulating oxide 56 thermally grown; gate oxide 46 is grown to a thickness of 250 Å, and oxide 56 is, consequently, somewhat thicker because it is simultaneously grown on n+ doped polysilicon 50. Lastly, 7000 Å of n+ polysilicon is deposited by LPCVD and patterned and etched to form word lines 14. See FIG. 3 for the completed cell. Note that gate 16 (the portion of word line 14 opposite channel 44) controls all of channel 44 despite the thickness of oxide 56 because n region 48, which forms the source for transistor 18, is formed by a diffusion of dopants from polysilicon 50 through polysilicon region 49 and thus extends into epilayer 34 vertically from region 49 as well as horizontally. This vertical diffusion extends sufficiently so that gate 16 will control all of channel 44.

Figure 5:
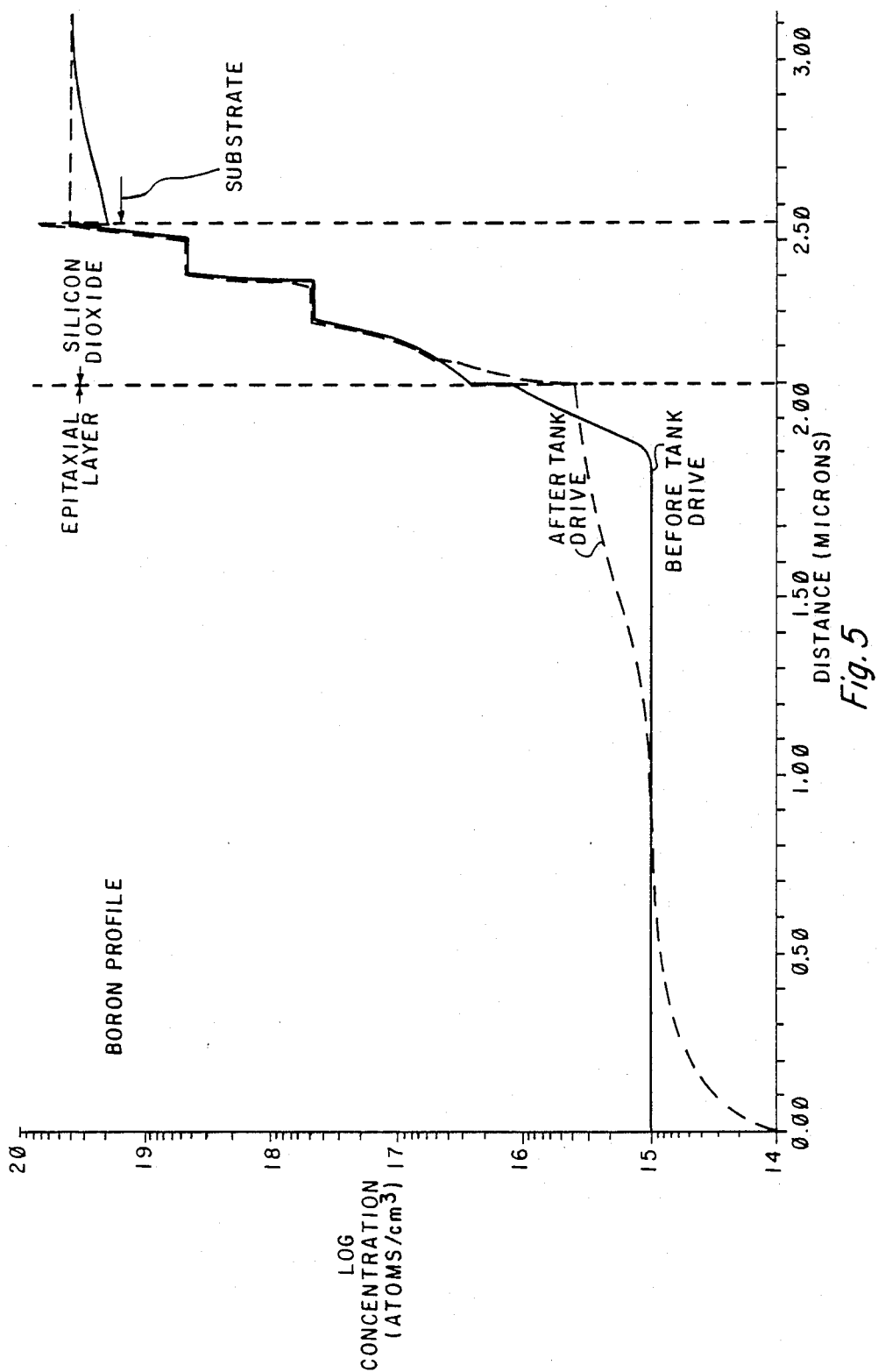
FIG. 5 is a doping profile of a P epitaxial layer, silicon dioxide layer and P+ substrate fabricated in accordance with the teachings of the described embodiment of the invention.

FIG. 5 shows the doping profile of substrate 32, silicon dioxide layer 33 and epilayer 34. This graph shows how the low doping level of epilayer 34 is maintained. An additional advantage of the present structure is that silicon dioxide layer 33, being an insulator, blocks potential leakage current from substrate 32 to the buried lateral contacts, thus increasing the refresh time of a memory incorporating cell 30.

Many modifications of the preferred embodiments are available which still fall within the scope of the invention in that such modifications, either singly or in combinations, do not disrupt the storage of signal charge by the capacitor nor the on/off function of the transistor. Such modifications include the following:

The trench cross section could be whatever shape is convenient, such as circular, rectangular, arbitrary convex, corrugated, even multiconnected (i.e. involving multiple trenches) and could even vary along the vertical, continuously or in steps or both. Similarly, the trench sidewalls need not be vertical, rather any geometry that can be processed should work to a greater or lesser extent, such as bulging, tapered, and sloped sidewalls; indeed, any simply connected trench is functionally equivalent to the parallelepiped of the preferred embodiment. Lastly, the dimensions of the trench (depth, cross sectional area, diameter, and so forth) may be varied but in practice are a tradeoff of process convenience, capcitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxide-nitride, oxide-nitride-oxide, and other stack combinations, and the oxide could be thermally grown, LPCVD, grown dry or in steam, and so forth. The thickness of the insulator is a tradeoff of process convenience, insulator realibility, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitance insulator will be a corresponding material. Also, for the capacitor formed by a reverse biased junction, the doping profiles may be varied, the choice will be a tradeoff of process convenience, cell size, capacitor performance, and so forth. Similarly, amorphous silicon could be used in place of polysilicon, and the etch back to form the crevices may be wet or dry (plasma).

The transistor can be formed to operate with a variety of threshold voltages by adjusting the threshold voltage (such as by a shallow diffusion on the channel just prior to gate oxide growth or deposition). The doping levels and the doping species can be varied so as to vary the transistor characteristics; note that the transistor channel length is determined approximately by trench depth and channel width is roughly equal to the trench perimeter and than n-channel and p-channel devices require oppositely doped regions. The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, and so forth.

Although specific embodiments of the present invention are described herein, this is not to be construed as limiting the scope of the claimed invention. The invention is limited only by the appended claims.

We claim:

1. A semiconductor electrical device comprising:
    a doped substrate;
    a diffusion barrier formed substantially at the surface of said substrate, said diffusion barrier preventing the diffusion of dopant atoms from said substrate;
    a single crystal semiconductor layer formed on the surface of said diffusion barrier; and
    a trench having an opening at the surface of said crystalline semiconductor layer, said trench extending through said diffusion barrier and into said dope substrate;
    a capacitor at least partially formed in said trench; and
    a transistor having a channel formed in a surface of said single crystal semiconductor layer and being electrically connected to said capacitor.

2. The device of claim 1 wherein said capacitor comprises:
    a conductive layer formed in said trench but insulated from said substrate, said conductive layer serving as a first plate of said capacitor, and said substrate serving as a second plate of said capacitor.

3. A semiconductor electrical device comprising:
    a doped silicon substrate;
    a layer of silicon dioxide formed substantially at the surface of said substrate, said layer of silicon dioxide preventing the diffusion of dopant atoms from said substrate;
    a single crystal semiconductor layer formed on the surface of said layer of said layer of silicon dioxide;
    a trench having an opening at the surface of said crystalline semiconductor layer and extending through said layer of silicon dioxide into said doped silicon substrate;
    a capacitor at least partially formed in said trench; and
    a transistor having a channel formed in a surface of said single crystal semiconductor layer and being electrically connected to said capacitor.

4. The device of claim 3 wherein said capacitor comprises;
    a conductive layer formed in said trench but insulated from said substrate, said conductive layer serving as a first plate of said capacitor, and said substrate serving as a second plate of said capacitor.

* * * * *